(12) United States Patent
Kiyono et al.

(10) Patent No.: US 10,209,289 B2
(45) Date of Patent: *Feb. 19, 2019

(54) PREDICTING SERVICE LIFE OF ELECTRICAL EQUIPMENT

(71) Applicant: International Business Machines Corporation, Armonk, NY (US)

(72) Inventors: Satsuo Kiyono, Yokohama (JP); Eiji Ohno, Yamato (JP); Masahiro Uemura, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/837,880

(22) Filed: Dec. 11, 2017

(65) Prior Publication Data

US 2018/0100886 A1    Apr. 12, 2018

Related U.S. Application Data

(63) Continuation of application No. 15/379,248, filed on Dec. 14, 2016, now Pat. No. 9,891,259, which is a
(Continued)

(30) Foreign Application Priority Data

May 29, 2014    (JP) ................. 2014-111792

(51) Int. Cl.
*G01K 3/04* (2006.01)
*G01R 31/04* (2006.01)
(Continued)

(52) U.S. Cl.
CPC .............. *G01R 31/04* (2013.01); *G01K 3/04* (2013.01); *G01R 31/027* (2013.01)

(58) Field of Classification Search
CPC .......... G01K 3/04; G01R 31/04; G01R 31/027
See application file for complete search history.

(56) References Cited

U.S. PATENT DOCUMENTS

2012/0292774 A1* 11/2012 Itoh ..................... H01L 24/85
                                                                257/769
2016/0320324 A1* 11/2016 Zhang ................ G01K 11/3206

FOREIGN PATENT DOCUMENTS

CN     103364658 A  * 10/2013    ......... G01K 11/3206
JP     04-047259 A     2/1992
(Continued)

OTHER PUBLICATIONS

Y. Mizutani et al., Study on Prediction Method of Thermal Deterioration of Pole Transformer with Overloaded Condition, 2001, Proceedings of teh 2001 International Symposium on Electrical Insulating Materials (ISEIM 2001), 2001 Asian Conference of Electrical Insulating Diagnosis (ACEID 2001), 33rd Sym, pp. 591-594.*

(Continued)

*Primary Examiner* — John Breene
*Assistant Examiner* — Yaritza H Perez Bermudez
(74) *Attorney, Agent, or Firm* — Kelsey M. Skodje

(57) ABSTRACT

The service life of electrical equipment is predicted using a thermal history sensor mounted in the electrical equipment. At least one thermal history sensor is mounted inside or on an outer wall surface of electrical equipment. The thermal history sensor includes dissimilar metal joints, and the resistance values of the dissimilar metal joints change in response to the amount of intermetallic compound growing in the dissimilar metal joints due to the temperature inside the electrical equipment or of the outer wall thereof during operation. A determining mechanism periodically or irregularly monitors and stores in memory the resistance values of the dissimilar metal joints from the thermal history sensor, (Continued)

and uses the stored history of resistance values to predict the service life of the electrical equipment.

8 Claims, 3 Drawing Sheets

Related U.S. Application Data continuation of application No. 14/726,056, filed on May 29, 2015, now Pat. No. 9,891,260.

(51) Int. Cl.
  *G01R 31/27* (2006.01)
  *G01R 31/02* (2006.01)

(56) References Cited

FOREIGN PATENT DOCUMENTS

| | | |
|---|---:|---|
| JP | 09271178 A | 10/1997 |
| JP | 2005286009 A | 10/2005 |
| JP | 2007113983 A | 5/2007 |
| JP | 2009-169483 A | 7/2009 |
| JP | 2011-214963 A | 10/2011 |
| JP | 2012074706 A | 4/2012 |
| JP | 2015225050 A | 12/2015 |

OTHER PUBLICATIONS

Mizutani et al., "Study on Prediction method of Thermal Deterioration of Pole Transformer with Overloaded Condition," Proceedings of the 2001 International Symposium on Electrical Insulating Materials (ISEIM 2001), 2001 Asian Conference on Electrical Insulating Diagnosis (ACEID 2001), 33rd Symposium on Electrical and Electronic Insulating Materials and Applications in Systems (IEEE Cat. No. 01TH8544), 2001, pp. 591-594.
Mizutani et al., "Lifetime Evaluation Method for Pole Transformer Based on Transient Temperature Analysis," IEEJ Transactions on Power and Energy, vol. 127, No. 5, pp. 653-658, 2007. (Abstract Only) http://doi.org/10.1541/ieejpes.127.653.
Decision to Grant a Patent, JP Patent Application No. 2014-111792, dated Oct. 7, 2016.
Kiyono et al., "Predicting Service Life of Electrical Equipment," U.S. Appl. No. 14/726,056, filed May 29, 2015.
Kiyono et al., "Predicting Service Life of Electrical Equipment," U.S. Appl. No. 15/379,248, filed Dec. 14, 2016.
Kiyono et al., "Predicting Service Life of Electrical Equipment," U.S. Appl. No. 15/837,849, filed Dec. 11, 2017.
List of IBM Patents or Patent Application Treated as Related, Signed Dec. 11, 2017, 2 pages.

* cited by examiner

PREDICTING SERVICE LIFE OF ELECTRICAL EQUIPMENT

BACKGROUND

Electrical equipment and electrical installations remaining in operation over an extended period of time, such as pole transformers, have to be monitored and maintained in order to avoid accidents due to failure. The accidents and failures that are a concern include malfunctions related to power outages caused by a drop in voltage over the power network, fires, and service life. Existing electrical equipment has to be replaced with new equipment before the end of its service life. However, much electrical equipment is able to remain in service and it is uneconomical to replace the equipment on a regular schedule.

SUMMARY

An example device for predicting a service life of electrical equipment includes at least one thermal history sensor mounted inside or on an outer wall surface of electrical equipment. The thermal history sensor includes dissimilar metal joints. The resistance values of the dissimilar metal joints change in response to the amount of intermetallic compound growing in the dissimilar metal joints due to the temperature inside the electrical equipment or of the outer wall thereof during operation. The device includes a determining mechanism to periodically or irregularly monitor and store in memory the resistance values of the dissimilar metal joints from the thermal history sensor, and to use the stored history of resistance values to predict the service life of the electrical equipment.

An example management system for electrical equipment includes at least one thermal history sensor mounted inside or on an outer wall surface of electrical equipment. The thermal history sensor includes dissimilar metal joints. The resistance values of the dissimilar metal joints change in response to the amount of intermetallic compound growing in the dissimilar metal joints due to the temperature inside the electrical equipment or of the outer wall thereof during operation. The system includes a determining mechanism to periodically or irregularly monitor and store in memory the resistance values of the plurality of dissimilar metal joints from the thermal history sensor, and use the stored history of resistance values to predict a service life of the electrical equipment. The system includes a computing device to receive predictions of the service life of electrical equipment and to use the predictions to manage the electrical equipment.

An example method for predicting a service life of electrical equipment includes preparing at least one thermal history sensor mounted inside or on an outer wall surface of electrical equipment. The thermal history sensor includes dissimilar metal joints, and is configured so that the resistance values of the dissimilar metal joints change in response to the amount of intermetallic compound growing in the dissimilar metal joints due to the temperature inside the electrical equipment or of the outer wall thereof during operation. The method includes periodically or irregularly monitoring and storing in memory the resistance values of the plurality of dissimilar metal joints from the thermal history sensor. The method includes predicting the service life of the electrical equipment using the stored history of resistance values.

BRIEF DESCRIPTION OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

DETAILED DESCRIPTION

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure.

As noted in the background section, much electrical equipment can remain in service such that it is uneconomical to replace the equipment on a regular schedule. A replacement timetable for electrical equipment can be determined by estimating the degradation, failure, and the service life of electrical equipment that has been in operation over an extended period of time. In one conventional system, a device such as an RFID device is installed to monitor equipment such as pole transformers individually, and a database is created to manage the status of the equipment. In such a system, a function computes an attrition coefficient for each region, and the degree of attrition of equipment in each region is calculated and stored. Equipment to be replaced is then determined by taking into account various limiting conditions, such as equipment ratings, equipment layout, manufacturer warranty period, and geographical location (site).

A conventional device can determine whether or not a transformer has failed. Such a device includes an alternating current voltage applying mechanism for outputting alternating current voltage, a failure determining unit for determining whether or not a short circuit has occurred in the windings of the transformed on the basis of the phase difference between the excitation current and the alternating current voltage when alternating current voltage has been applied to the transformer by the alternating current voltage applying mechanism, and a notification unit for sending a notification of the results of the failure determining unit.

However, these conventional approaches do not predict deterioration or service life of electrical equipment using the thermal history of the electrical equipment operating at a relatively high temperature. Disclosed herein, by comparison, are techniques for predicting the service life of electrical equipment using a thermal history sensor mounted in the electrical equipment. As such, the drawbacks of the conventional approaches are ameliorated.

Figure 1:
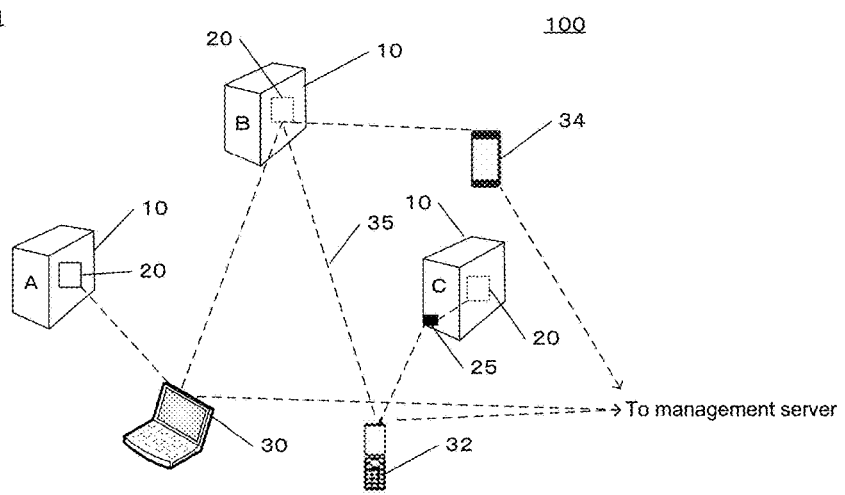
FIG. 1 is a diagram showing a configuration example of an example system including a device for predicting the service life of electrical equipment.

FIG. 1 is a diagram showing a configuration example of an example system including a device for predicting the service life of electrical equipment. The system 100 includes three units of electrical equipment 10 (A-C), a communication network 35 illustrated using dotted lines, and terminals 30, 32, 34 (PC, mobile phone, smartphone, etc.) able to connect to the communication network 35. The electrical equipment 10 includes any device operated by power (electricity) that becomes hot internally during operation (electrical devices, electronic devices, semiconductor devices, etc.). The electrical equipment 10 includes pole transformers mounted on utility poles, wind turbines, and artificial satellites.

Each terminal 30, 32, 34 is configured to allow acquired data to be sent via the communication network 35 to a management server used to manage data. The communication network 35 can be wired or wireless. Each terminal functions as a determining mechanism, and includes hardware to execute software (a computer program) to predict the service life of the electrical equipment. In other words, each terminal, as a determining mechanism, periodically or irregularly monitors and stores in memory the resistance values of the dissimilar metal joints from the thermal history sensor described in detail below, and uses the stored history of resistance values to predict the service life of the electrical equipment.

At least some of the functions of the determining mechanism may be executed by the management server. The system in FIG. 1 may include any number and any type of electrical equipment and terminal. These can be selected and established according to the scale of the network.

Each unit of electrical equipment 10 includes a thermal history sensor 20. A thermal history sensor 20 can be installed inside the electrical equipment, on an outer wall surface of the equipment, or both. In FIG. 1, unit A of the electrical equipment 10 has a thermal history sensor 20 installed on the outer wall surface of the electrical equipment 10. Unit B and unit C of the electrical equipment 10 have a thermal history sensor 20 installed inside the electrical equipment 10. Unit C of the electrical equipment 10 has terminals 25 installed on the outer wall surface of the electrical equipment 10 to extract and send signals from the thermal history sensor 20.

Each thermal history sensor 20 is able to generate signals and communicate with the terminals 30-34. The communication can also be conducted using RFID technology. In unit B of the electrical equipment 10, the thermal history sensor 20 is configured to communicate directly from inside the electrical equipment 10 with the terminals 30-34 via radio signals. The data (resistance values) is sent from the thermal history sensor 20 to the terminals 30, 32, and 34.

Figure 2:
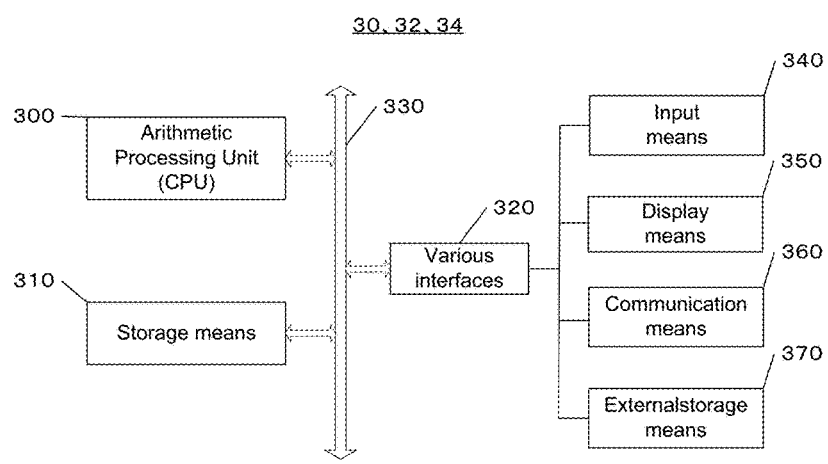
FIG. 2 is a diagram showing a configuration example of an example terminal, or determining mechanism.

FIG. 2 is a block diagram showing a configuration example of an example terminal 30, 32, 34. The terminal includes an arithmetic processing unit (CPU) 300, a storage mechanism 310, and various interfaces 320 connected to each other via a bus 330. The arithmetic processing unit (CPU) 300, as described below, uses data (resistance values) acquired from the thermal history sensor 20 and stored in memory to predict or estimate the service life of the electrical equipment.

The term various interfaces 320 refer to the input interface, output interface, external storage interface, and the external communication interface among others. These interfaces are connected to an input mechanism 340 such as touch keys, a touch panel or keyboard, a display mechanism 350 such as an LCD, a wired or wireless communication mechanism 360, or an eternal storage mechanism 370 such as USB-connected semiconductor memory or an HDD. The storage mechanism 310 can be semiconductor memory such as RAM, ROM or Flash memory, or an HDD. The storage mechanism 310 stores data (resistance values) acquired from the thermal history sensor 20.

Figure 3:
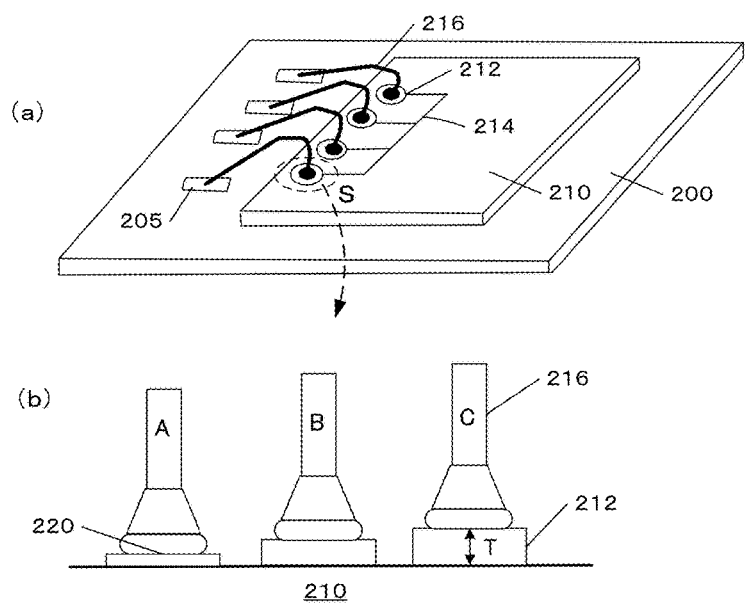
FIG. 3 is a diagram showing a configuration example of an example thermal history sensor.

FIG. 3 is a diagram showing a configuration example of an example thermal history sensor 20. In this figure, (a) is an overall view of the thermal history sensor 20, and (b) is an enlarged cross-sectional view of the dissimilar metal joints S in the thermal history sensor 20. The thermal history sensor 20 includes a board 200, and a chip 210 mounted on the board. The board 200 is a printed circuit board including appropriate circuits and wiring. A stitch bonding pad 205 is provided on the surface of the board 200. The chip 210 is a semiconductor chip including appropriate circuits and wiring. The circuits in the board 200 and the chip 210 include a circuit with the dissimilar metal joints S and a circuit for detecting and outputting the resistance values in the wiring. These circuits are operated by power supplied from a dedicated battery for the thermal history sensor 20 or from the electrical equipment.

A number of dissimilar metal joints S are provided on the surface of the chip 210. In FIG. 3(*a*), four dissimilar metal joints S are provided, but this is for illustrative purposes only. Any number of joints can be selected depending on the specifications of the electrical equipment and the length of the operating period. Each dissimilar metal joint has a pad portion 212, and a metal wire portion 216 joined to the ball bonding pad portion 212. One end of the metal wire portion 216 is connected to a stitch bonding pad 205 on the board 200. These four dissimilar metal joints S are connected electrically by chip circuit 214.

The ball bonding pad portion 212 is made of a metal such as aluminum. The ball bonding pad portion 212 is formed using a thin film forming technique such as deposition or sputtering, a metal plating technique, or a patterning (lithography) technique. The metal wire portion 216 is made of a wire such as gold. The metal wire portion 216 can be formed using the conventional wire bonding technique. Each dissimilar metal joint S is a combination of an aluminum pad and a gold wire. The combination in the dissimilar metal joints is not restricted to this example. They can essentially be a combination of at least two metals with different temperature-dependent diffusion coefficients.

In one implementation, a metal with the higher diffusion coefficient is used in the pad portion, and a metal with a lower diffusion coefficient than the pad portion is used in the wire portion. In this way, changes in the resistance values caused by the diffusion of the metal and growth of intermetallic compounds in dissimilar metal joints S due to the Kirkendall effect (phenomenon) can be used. In other words, changes in resistance values caused by the generation and growth of so-called Kirkendall voids can be used. The term Kirkendall effect (phenomenon) refers to movement of the interface between two types of metals (220 in FIG. 3 (*b*)) due to the diffusion of metal atoms. The term Kirkendall void refers to voids created at the metal interface 220 by the Kirkendall effect (phenomenon).

In FIG. 3(*b*), three dissimilar metal joints A-C are provided on the surface of a chip 210. The dissimilar metal joints A-C include three pads 212 of different thicknesses T, and wire portions 216. In FIG. 3(*b*), the thickness of the pads 212 increases in successive order from A to C. The reason for the change in thickness is to be able to control the amount of metal diffused in the dissimilar metal joints and the amount of growth in the intermetallic compounds in response to the operating conditions of the electrical equipment in which the thermal history sensor 20 is mounted (internal temperature, external temperature, operating period, etc.).

A thin pad such as the one in A may be selected for electrical equipment already in use in order to monitor for the cumulative rate (number) of change in the resistance value at or above a predetermined threshold value prior to the end of the service life (including disconnects or open circuits). A thick pad such as the one in C is selected for electrical equipment with a relatively high internal temperature. This too may be used to monitor for the cumulative rate (number) of change in the resistance value at or above a predetermined threshold value prior to the end of the service life (including disconnects or open circuits).

Figure 4:
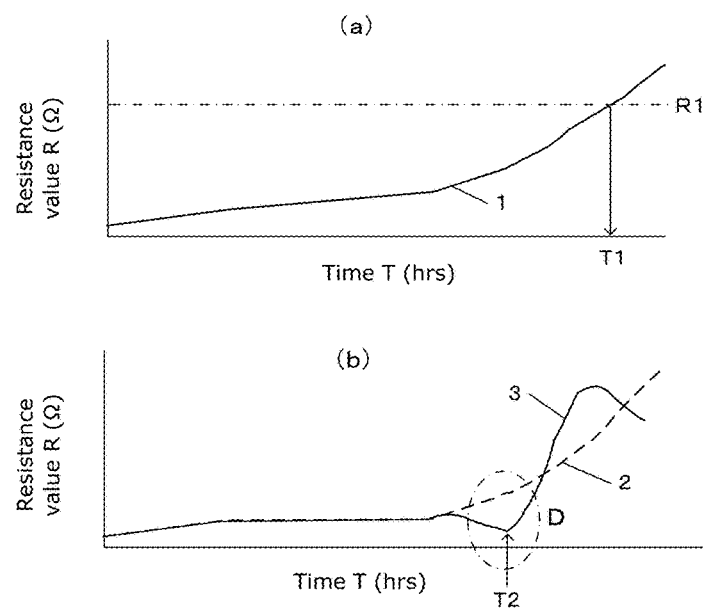
FIG. 4 is a diagram showing the relationship between the resistance used by an example thermal history sensor and operating time of an example electrical device.

FIG. 4 is a diagram showing the relationship between the resistance value R used by an example thermal history sensor and the operating time T of an example electrical device. In graph 1 of FIG. 4 showing the change in the resistance value R, the change in the resistance value corresponds to the diffusion of the metal and growth of intermetallic compounds in the dissimilar metal joints S due to the Kirkendall effect (phenomenon). In FIG. 4 (a), the resistance value R changes gradually relative to the operating time T of the electrical equipment.

In Graph 1, the resistance value R changes in a form that closely follows a graph (approximate expression) calculated in accordance with the so-called Arrhenius relational expression. The graph calculated in accordance with the Arrhenius relational expression is described below with reference to FIG. 5. As shown in FIG. 4, a predetermined threshold resistance value R1 can be established, and the service life of electrical equipment can be determined as the point at which the resistance value R is equal to or greater than the predetermined threshold resistance value R1. In other words, the operating time T1 at which the predetermined threshold resistance value R1 is reached can be used to determine the service life of the electrical equipment.

In FIG. 4(b), the resistance value R changes abruptly relative to the operating time T of the electrical equipment. Graph 2 indicated by the dotted line is the graph (approximate expression) calculated in accordance with the Arrhenius relational expression. Graph 3, as in the case of FIG. 4 a), shows the change in the resistance value corresponding to the diffusion of the metal and growth of intermetallic compounds in the dissimilar metal joints S due to the Kirkendall effect (phenomenon). However, in graph 3, the cause of the abrupt change in the growth of intermetallic compounds inside the electrical equipment is the abrupt change (decrease) in the resistance value R in the area surrounded by oval D.

An abrupt change in the resistance value can be presumed, and the service life of the electrical equipment can be determined, by establishing a threshold value ΔR for the amount of change in the resistance value. In other words, operating time T2 at which the threshold value ΔR for the amount of change in the resistance value was exceeded can be used to determine that the service life of the electrical equipment has been reached. The threshold value ΔR for the amount of change in the resistance value can be established for a decrease or increase in the resistance value.

Figure 5:
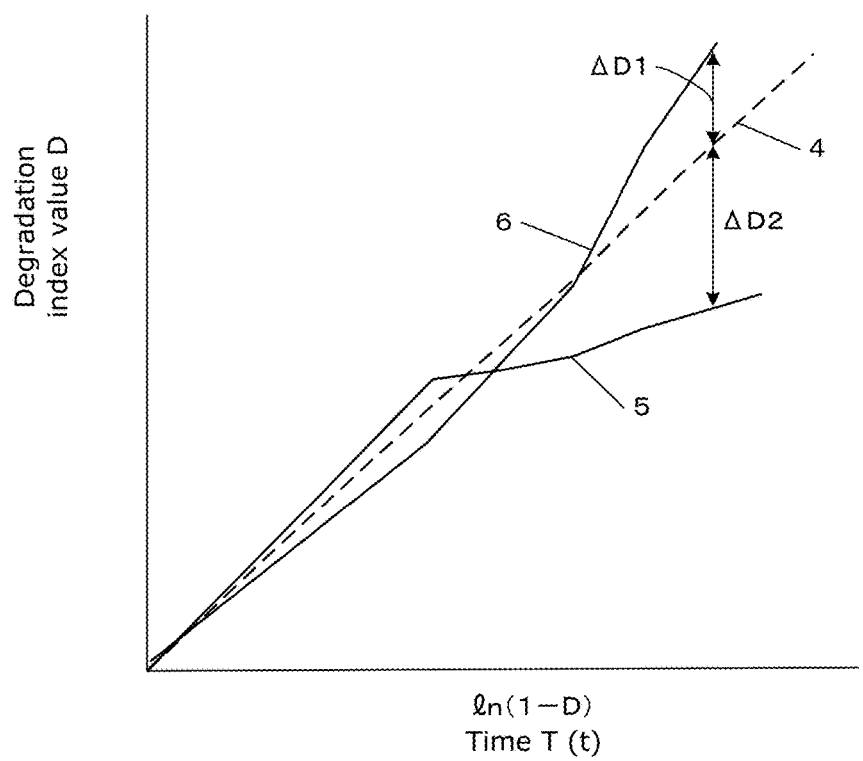
FIG. 5 is a diagram showing an example of an electrical equipment deterioration prediction by example service life prediction.

FIG. 5 is a diagram showing an example of an electrical equipment deterioration prediction by an example service life predicting device or method. FIG. 5 is thus a graph showing the relationship between time T (t) and degradation index value D. In FIG. 5, graph 4 indicated by a dotted line is the graph (approximate expression) calculated in accordance with the Arrhenius relational expression. Graph 5 and graph 6 indicate by solid lines are simulation graphs using changes in resistance values corresponding to the diffusion of metal and growth of intermetallic compounds in the dissimilar metal joints S due to the Kirkendall effect (phenomenon).

The degradation index value (D), or diffusion constant D, in FIG. 5 can be determined using the Arrhenius relational expression as shown below.

(a) Arrhenius Relational Expression:

$$X_2 = D \cdot t$$

$$D = D_0 \cdot \exp(-Ea/KT) \quad (1)$$

D: Diffusion constant
Ea: Activation energy
$D_0$: Frequency factor
K: Boltzmann constant ($8.6157 \times 10^{-5}$ eV/K) T: Absolute temperature (K)

(b) Time vs. Degradation Index Equation:

$$D = \frac{1}{1 + (\sum \Delta t / \tau)^\alpha} \cdot \tau = \exp(A + B/T\omega) \quad (2)$$

$$\therefore D = \frac{1}{1 + (\int 1/\tau dt)^\alpha} \cdot \tau = \exp(A + B/T\omega)$$

(c) Relationship to Resistance Value:

$$L^2 = \int D = D_0 \cdot \exp(-Ea/kT(t)) dt \quad (3)$$

In graph 5 of the degradation index value D shown in FIG. 5, the slope levels off somewhat in the middle (ΔD2). Therefore, in this case, the service life of the electrical equipment can be considered long (long service life) relative to the standard established by the approximate expression (graph 4) indicated by the dotted line. In graph 6 of the degradation index value D, the slope begins to rise more sharply in the middle (ΔD1). Therefore, in this case, the service life of the electrical equipment can be considered short (short service life) relative to the standard established by the approximate expression (graph 4) indicated by the dotted line. The simulation graph shown in FIG. 5 can be determined beforehand to predict and estimate the service life of electrical equipment.

In conclusion, various aspects of the techniques consistent with what has been described above are described. In one aspect, a device is provided for predicting the service life of electrical equipment. This device includes (a) at least one thermal history sensor mounted inside or on an outer wall surface of electrical equipment, the thermal history sensor including a number of dissimilar metal joints, and the resistance values of the dissimilar metal joints changing in response to the amount of intermetallic compound growing in the dissimilar metal joints due to the temperature inside the electrical equipment or of the outer wall thereof during operation; and (b) determining mechanism for periodically or irregularly monitoring and storing in memory the resistance values of the dissimilar metal joints from the thermal history sensor, and using the stored history of resistance values to predict the service life of the electrical equipment. In this aspect, thermal degradation of electrical equipment currently in operation can be grasped from the history of the resistance values of the dissimilar metal joints of the thermal history sensor, the service life of the electrical equipment can be predicted, and the timetable for servicing or replacing the electrical equipment can be rationally and effectively determined.

In one aspect, the determining mechanism uses as the service life of the electrical equipment the time until the percentage of dissimilar metal joints whose resistance value exceeds a predetermined threshold resistance value reaches a predetermined threshold percentage. In this aspect, the service life of electrical equipment can be predicted by determining the percentage (number) of dissimilar metal joints whose resistance value exceeds a predetermined resistance value.

In one aspect, the determining mechanism uses as the service life of the electrical equipment the time until the rate of change in the resistance values exceeds a predetermined threshold rate of change. In this aspect, the service life of electrical equipment can be appropriately predicted in response to rapid thermal degradation of the electrical equipment.

In one aspect, the dissimilar metal joints include a number of metal pads on a board and a metal wire made of a second metal (for example, gold) having a diffusion coefficient lower than the diffusion coefficient of a first metal (for example, aluminum) for the metal pads, which is bonded to the metal pads. In this aspect, the amount of intermetallic metal generated is changed using the diffusion of metal in the dissimilar metal joints, that is, using the so-called Kirkendall effect (phenomenon). As a result, the resistance value of metal wiring including these dissimilar metal joints can be changed. In this aspect, the thermal history of the electrical equipment can be grasped using a metal wire bonding, which is a technique commonly used in the manufacture of semiconductors. The thermal history of the electrical equipment can also be adaptively grasped based on the operating state inside the electrical equipment, especially from the operating temperature.

In one aspect, the metal pads include metal pads of different thicknesses. In this aspect, the amount of metal diffusion in the dissimilar metal joints and the amount of intermetallic compound growth can be controlled based on the operating conditions of the electrical equipment including the thermal history sensor 20 (internal temperature, external temperature, operating period, etc.).

In one aspect, the determining mechanism uses as the service life of the electrical equipment the time until the percentage of disconnected metal wires on the metal pads reaches a predetermined threshold percentage. In this aspect, the service life of electrical equipment can be predicted by determining the percentage (number) of severed metal wires.

In one aspect, the thermal history sensor includes a number of terminals for outputting resistance values, and the determining mechanism stores in memory the resistance values received over a line or wirelessly from the terminals in the thermal history sensor. In this aspect, the thermal history inside the electrical equipment can be grasped from outside of the electrical equipment.

In one aspect, the electrical equipment is a pole transformer installed on a utility pole, the thermal history sensor is provided inside the pole transformer, and the terminals of the thermal history sensor are drawn out from the outer wall of the pole transformer. In this aspect, the thermal history inside a pole transformer can be grasped under the utility pole on which the pole transformer has been mounted.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A management system for electrical equipment comprising:
    at least one thermal history sensor mounted inside or on an outer wall surface of electrical equipment, the thermal history sensor including a plurality of dissimilar metal joints having resistance values that change in response to an amount of intermetallic compound growing in the dissimilar metal joints due to a temperature inside the electrical equipment or the outer wall thereof during operation, wherein the plurality of dissimilar metal joints includes a plurality of metal pads of different thicknesses on a board and a metal wire made of a second metal having a diffusion coefficient lower than a diffusion coefficient of a first metal of the metal pads; and
    a determining mechanism to periodically or irregularly monitor and store in memory the resistance values of the plurality of dissimilar metal joints from the thermal history sensor, and use the stored resistance values to predict a service life of the electrical equipment.

2. The management system according to claim 1, wherein the determining mechanism uses as the service life of the electrical equipment the time until the percentage of dissimilar metal joints whose resistance value exceeds a predetermined threshold resistance value reaches a predetermined threshold percentage.

3. The management system according to claim 1, wherein the determining mechanism uses as the service life of the electrical equipment the time until the rate of change in the resistance values exceeds a predetermined threshold rate of change.

4. The management system according to claim 1, wherein the thermal history sensor includes a plurality of terminals for outputting resistance values, and the determining mechanism stores in memory the resistance values received over a line or wirelessly from the plurality of terminals in the thermal history sensor.

5. The management system according to claim 1, wherein the determining mechanism uses as the service life of the electrical equipment the time until the percentage of disconnected metal wires on the plurality of metal pads reaches a predetermined threshold percentage.

6. The management system according to claim 1, wherein the first metal of the metal pads is aluminum, and the second metal of the metal wire is gold.

7. The management system according to claim 1, wherein the thermal history sensor includes a plurality of terminals for outputting resistance values, and the determining mechanism stores in memory the resistance values received over a line or wirelessly from the plurality of terminals in the thermal history sensor.

8. The management system according to claim 1, wherein the electrical equipment is a pole transformer installed on a utility pole, the thermal history sensor is provided inside the pole transformer, and the terminals of the thermal history sensor are drawn out from the outer wall of the pole transformer.

* * * * *